United States Patent [19]
Kersh, III

[11] Patent Number: 5,787,091
[45] Date of Patent: Jul. 28, 1998

[54] SHARED REDUNDANCY PROGRAMMING OF MEMORY WITH PLURAL ACCESS PORTS

[75] Inventor: David V. Kersh, III, Sugar Land, Tex.

[73] Assignee: Texas Instruments Incorporated, Dallas, Tex.

[21] Appl. No.: 489,973

[22] Filed: Jun. 13, 1995

[51] Int. Cl.$^6$ ........................................... G11C 7/00
[52] U.S. Cl. ............................................... 371/10.3
[58] Field of Search ........................... 365/200, 225.7, 365/189.07, 230.09; 371/10.2, 10.3

[56] References Cited

U.S. PATENT DOCUMENTS

| | | | |
|---|---|---|---|
| 5,258,953 | 11/1993 | Tsujimoto | 365/200 |
| 5,278,793 | 1/1994 | Yeh | 365/200 |
| 5,347,489 | 9/1994 | Kwong et al. | 365/69 |
| 5,379,259 | 1/1995 | Fujita | 365/200 |
| 5,469,601 | 11/1995 | Gillingham | 365/230.06 |
| 5,528,539 | 6/1996 | Ong et al. | 365/200 |

*Primary Examiner*—David L. Robertson
*Assistant Examiner*—Denise Tran
*Attorney, Agent, or Firm*—Theodore D. Lindgren; Robby T. Holland; Richard L. Donaldson

[57] ABSTRACT

The circuit of this invention includes a programmable circuit (PC) for storing an internal address and for producing logic levels (LL1, etc.) determined by that internal address and includes a first comparison circuit (CC1) and a second comparison circuit (CC2). The first comparison circuit (CC1) responds to the logic levels (LL1, etc.) representative of that internal address and to a first address signal (CA0, etc.) to generate a first match signal (CRFSN) determined by matching of the internal address and the first address signal (CA0, etc.). The second comparison circuit (CC2) responds to the logic levels (LL1) and to a second address signal (SF0, etc.) to generate a second match signal (SRSJN) determined by the matching of the internal address and the second address signal (SF0, etc.).

21 Claims, 3 Drawing Sheets

SHARED REDUNDANCY PROGRAMMING OF MEMORY WITH PLURAL ACCESS PORTS

BACKGROUND OF THE INVENTION

The present invention relates to integrated-circuit memories, such as a Dynamic Random Access Memories (DRAMs). More particularly, this invention relates to use of a shared fuse set for serial and column redundancy programming on multi-ported memory devices having redundant columns for fused replacement of defective columns. One example of a multi-ported DRAM is a Video Random Access Memory (VRAM). A VRAM has a first port for parallel transmission and reception of data to and from a microprocessor and has a second port for serial transmission of data to a video display unit. The plural ports allow increased graphics performance.

Prior-art DRAMs and VRAMs contain redundant columns of memory cells. The redundant columns are used to replace columns with defective cells. Columns with defective cells are disabled from operation and the redundant columns are enabled to operate by altering connections on the chips through programming laser fuses. The fuse programming is usually performed prior to encapsulation of the chip. The replacement allows otherwise defective chips to be repaired, thus increasing process yield.

In a VRAM, or similar multi-ported device, the parallel-port data is taken from the sense amplifiers connected to each column of the memory cells. Typically, replacing a defective column with one of the redundant columns requires programming of logic circuitry from the defective-column sense amplifier to the redundant-column sense amplifier. In a VRAM, the serial port output is typically taken from Serial Access Memory (SAM) registers, which receive and store the parallel data from the sense amplifiers. If a defective-column sense amplifier is replaced with a redundant-column sense amplifier, then its associated SAM register must be replaced with the SAM register that connects to the redundant column sense amplifier.

Video random access memories are described in U.S. Pat. No. 4,639,890 issued Jan. 27, 1987, entitled VIDEO DISPLAY SYSTEM USING MEMORY WITH PARALLEL AND SERIAL ACCESS EMPLOYING SELECTABLE CASCADED SERIAL SHIFT REGISTERS; in U.S. Pat. No. 4,660,156 issued Apr. 21, 1987, entitled VIDEO SYSTEM WITH SINGLE MEMORY SPACE FOR INSTRUCTION, PROGRAM DATA AND DISPLAY DATA; in U.S. Pat. No. 4,689,741 issued Aug. 25, 1987, entitled VIDEO SYSTEM HAVING A DUAL-PORT MEMORY WITH INHIBITED RANDOM ACCESS DURING TRANSFER CYCLES; in U.S. Pat. No. 4,747,081 issued May 24, 1988, entitled VIDEO DISPLAY SYSTEM USING MEMORY WITH PARALLEL AND SERIAL ACCESS EMPLOYING SERIAL SHIFT REGISTERS SELECTED BY COLUMN ADDRESS; in U.S. Pat. No. 4,807,189 issued Feb. 21, 1989, entitled READ/WRITE MEMORY HAVING A MULTIPLE COLUMN SELECT MODE; in U.S. Pat. No. 4,817,058 issued Mar. 28, 1989, entitled MULTIPLE INPUT/OUTPUT READ/WRITE MEMORY HAVING A MULTIPLE-CYCLE WRITE MASK; in U.S. Pat. No. 4,866,678 issued Sep. 12, 1989, entitled DUAL-PORT MEMORY HAVING PIPELINED SERIAL OUTPUT; in U.S. Pat. No. 4,891,795 issued Jan. 2, 1990, entitled DUAL-PORT MEMORY HAVING PIPELINED SERIAL OUTPUT; in U.S. Pat. No. 4,897,818 issued January 30, 1990, entitled DUAL-PORT MEMORY WITH INHIBITED RANDOM ACCESS DURING TRANSFER CYCLES; in U.S. Pat. No. 5,042,014 issued Aug. 20, 1991 entitled DUAL-PORT MEMORY HAVING PIPELINED SERIAL OUTPUT; in U.S. Patent 5,163,024 issued Nov. 10, 1992 entitled VIDEO DISPLAY SYSTEM USING MEMORY WITH PARALLEL AND SERIAL ACCESS EMPLOYING SERIAL SHIFT REGISTERS SELECTED BY COLUMN ADDRESS; in U.S. Pat. No. 5,210,639 issued May 11, 1993, entitled DUAL-PORT MEMORY WITH INHIBITED RANDOM ACCESS DURING TRANSFER CYCLES WITH SERIAL ACCESS; and in U.S. Pat. No. 5,321,665 issued Jun. 14, 1994, entitled DUAL-PORT MEMORY HAVING A SERIAL REGISTER ACCESSING ARRANGEMENT WITH PULSED DECODING. Each of the foregoing patents is also assigned to Texas Instruments Incorporated and each of the foregoing patents is expressly incorporated herein.

Prior-art VRAMs use two separate sets of fuses, one to program the sense amplifier circuitry for the column redundancy and another to program the SAM registers for the serial redundancy. This requires a large layout space on the chip surface. The prior-art separate fuse sets are used because the column redundancy circuitry requires column address information to be programmed with the column fuses, while the serial redundancy circuitry requires column factor, or pre-decoded address, information to be programmed with the serial fuses.

SUMMARY OF THE INVENTION

This invention uses one set of fuses for both the column redundancy and the serial redundancy on DRAMs having redundant columns for fused replacement of defective columns and having Serial Access Memory (SAM) registers. Column address information is programmed into the common fuse set. That column address information is encoded into serial factor information for use by the serial redundancy circuitry. The encoding/commonfuse circuitry eliminates the need for separate fuse sets for column redundancy and for serial redundancy on such specialized DRAMs, including VRAMs.

The circuit of this invention includes a programmable circuit for storing an internal address and for producing logic levels representative of that internal address and includes a first comparison circuit and a second comparison circuit. The first comparison circuit responds to the logic levels and to a first address signal to generate a first match signal determined by matching of the internal address and the first address signal. The second comparison circuit responds to the logic levels and to a second address signal to generate a second match signal determined by the matching of the internal address and the second address signal.

DETAILED DESCRIPTION OF THE INVENTION

This invention uses one set of fuses to activate both column redundancy and serial redundancy on a VRAM. This is accomplished is by programming a common fuse set with column address information, then encoding that column address information into serial factor information for use by the serial redundancy circuitry.

Figure 1:
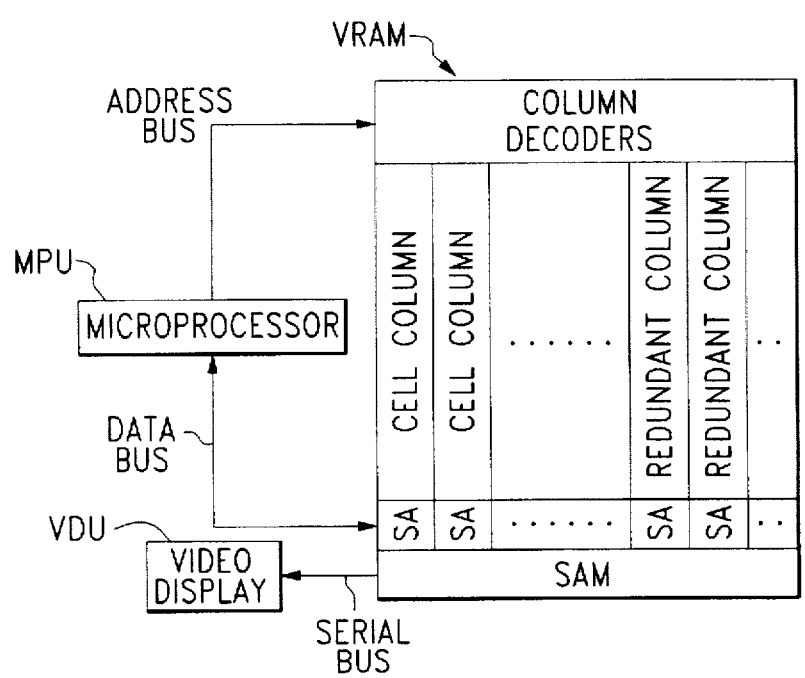
FIG. 1 shows a simplified partial block diagram of a VRAM connected to a microprocessor and to a video display unit.

FIG. 1 illustrates a video random access memory VRAM having CELL COLUMNS and REDUNDANT COLUMNS of cells. Each COLUMN is connected to a sense amplifier SA. Data from the sense amplifiers SA are transmitted by a DATA BUS to and from a microprocessor MPU that gives address instructions to the VRAM by means of an ADDRESS BUS. Data from the sense amplifiers SA are converted in the VRAM to serial form by serial access memory registers SAM. The converted data from the serial access memory registers SAM are transmitted by a SERIAL BUS to a video display unit VDU.

Figure 2:
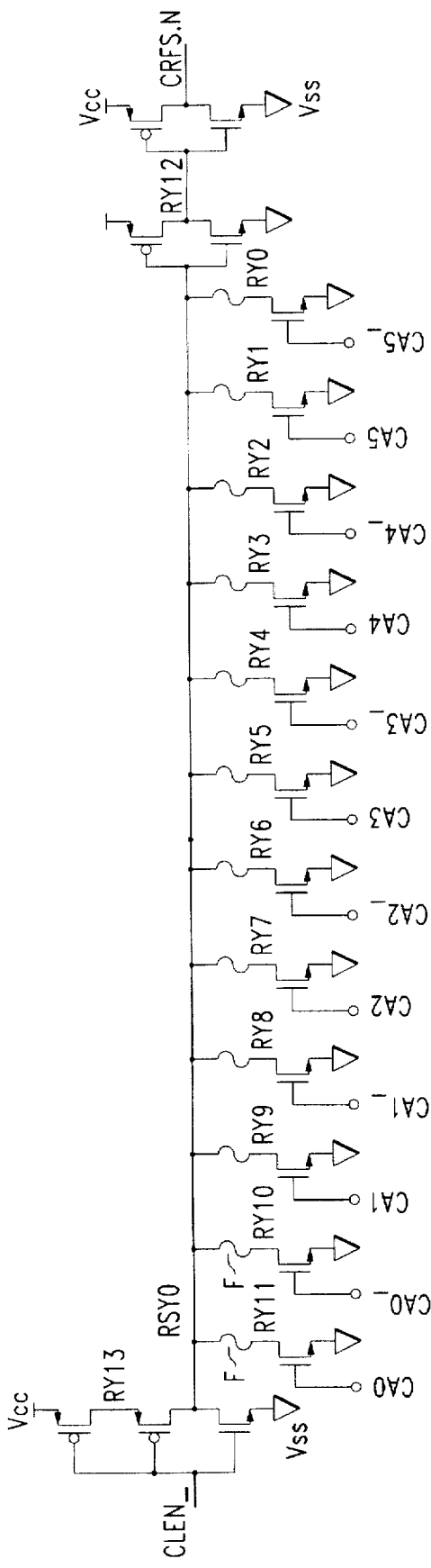
FIG. 2 shows a typical prior-art column redundancy circuit containing a set of laser fuses for replacing a defective column with a redundant column.

FIG. 2 shows a typical column redundancy circuit that contains a separate set of laser fuses F, column address inputs CA0 through CA5 _, and a column redundancy match output signal CRFSN to drive a redundant column-select line. (Address inputs CA0 and CA0_, for example, are inverse signals.) If a defective column is found during test, several of the laser fuses F are blown (opened) to match the address of that defective column. Therefore, during device operation, when the address of the defective column is received at the terminals of the memory chip, the redundancy circuit generates a match by causing node RSY0 to go high, which brings output CRFSN high to replace the defective column with a good redundant column. The circuit of FIG. 2 is activated by enabling signal CLEN_. However, for a VRAM, the defective column also requires circuitry of the serial access memory register SAM to be corrected to compensate for the change to a redundant column and sense amplifier output. In prior-art, this correction is performed by serial redundancy circuitry having a separate set of fuses.

Figure 3:
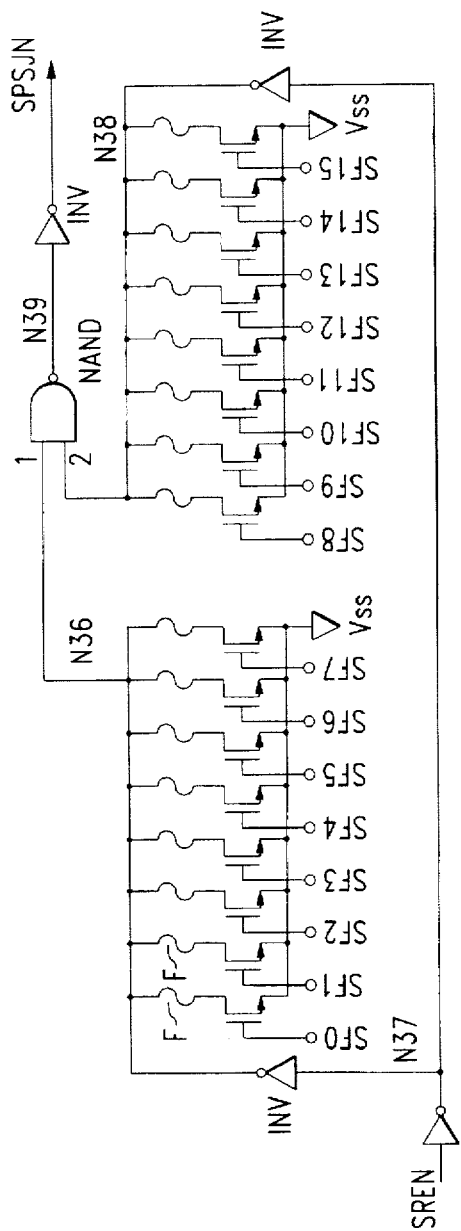
FIG. 3 shows a typical prior-art serial redundancy circuit containing a set of laser fuses for replacing the SAM register associated with a defective column with a redundant SAM register.

FIG. 3 shows a typical separate serial redundancy circuit having operation similar to the column redundancy circuit of FIG. 2. The serial redundancy circuit contains a set of laser fuses F, serial factor inputs SF0 through SF15, and a match output signal SRSJN to drive a redundant serial column-select line. If a defective column exists, some of the laser fuses F are blown (opened) to match the serial factors that correspond to the address of that defective column. Therefore, during device operation, when the address of the defective column is received by the serial circuitry, the redundancy circuit generates a match using the serial factor inputs that cause nodes N36 and N38 to go high, which brings output SRSJN high to replace the "defective" serial column with a good redundant serial column. The circuit of FIG. 3 is activated by enabling signal SREN.

To summarize, in the prior-art two sets of fuses are used to program serial and column redundancy separately, even though both fuse sets replace aspects of the same defective column address.

Figure 4:
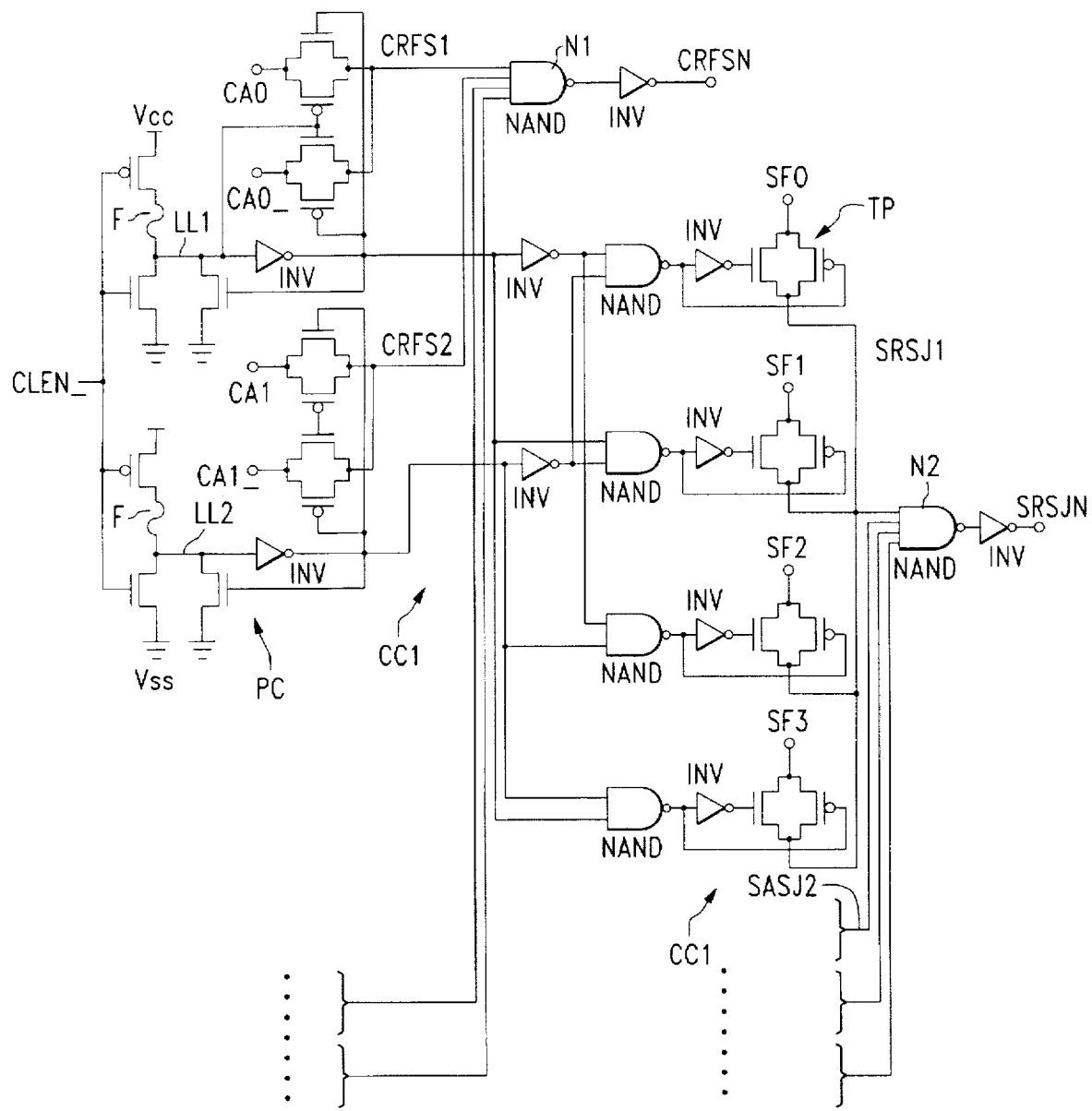
FIG. 4 is an electrical schematic diagram illustrating a circuit using one set of fuses for both column redundancy and serial redundancy.

FIG. 4 shows an example embodiment of the invention. The circuit of FIG. 4 includes shared laser fuses F in programmable circuit PC. Column address signal inputs include CA0, CA0_, CA1 and CA1_. The logic levels LL1, etc., at the outputs of programmable circuit PC are determined by programming fuses F and are compared by a comparison circuit CC1, which passes the column address signals or their complements, i.e., CA0 or CA0_, depending on whether or not the fuse is blown, to generate redundant column addresses CRFS1, CRFS2, etc. Comparison circuit CC1 includes a NAND circuit N1. The redundant column addresses CRFS1, etc., are transmitted to NAND circuit N1, which provides a match signal CRFSN for enabling particular redundant column when all the redundant column addresses CRFS1, etc., are high.

The fuse F information is also used for the serial redundancy. The redundant column information programmed into fuses F is used to pass the serial factor that corresponds to the programmed column address through to the serial redundancy circuitry, thus generating the redundant serial factors. Serial factor inputs include SF0, SF1, SF2 and SF3. A second comparison circuit CC2, which includes connected inverters INV and parallel connected source-drain transistors TP, compares the logic levels LL1, etc., (the inverse thereof) at the outputs of programmable circuit PC with corresponding serial factors SF0, SF1, SF2 and SF3, etc., to provide redundant serial factor data SRSJ1, SRSJ2, etc. Comparison circuit CC2 includes NAND circuit N2. The redundant serial factor data SRSJ1, SRSJ2, etc. are transmitted to NAND circuit N2, which provides an enabling redundant serial column-select signal, or second match signal SRSJN, when all the redundant serial factor data SRSJ1, SRSJ2, etc., are high.

For example, if the column that is accessed by CA0=1 and CA1=0 is bad, then only the top fuse is blown. During power-up of the chip, the control signal pulses so that the state of the fuses is latched on nodes N0 and N1. This causes node N0 to be latched low and node N1 to be latched high. This, in turn, passes signals CA0 and CA1_through the passgates to generate the redundant column addresses. Therefore, when a bad column is addressed, i.e., CA0=1 and CA1=0, both the redundant column addresses will be high since CA0=1 and CA1_=1. This enables the redundant column.

The serial redundancy also uses the fuse information stored in the latched nodes N0 and N1 to pass the corresponding serial factor input through to the serial redundancy circuitry. Node N0 low and node N1 high set nodes NA, NC and ND low and set node NB high. This allows the SF1 signal to pass through the passgate to generate the redundant serial factor. In effect, this programs the serial redundancy to the same column address as the column redundancy since the SF1 signal accesses the same memory location at CA0=1 and CA1=0.

This circuit is repeated multiple times on a chip in order to program all the addresses needed for redundancy. A modification of the circuit forms a 3:8 or a 4:16 decoder. The advantage of this invention is that it requires fewer fuses on-chip, thus saving space. In addition, the invention reduces the number of fuses required to be blown for correcting chip defects when using both column and serial redundancy.

The output, or match, signal CRFSN is transmitted to connected circuitry for controlling one of the access ports of the memory, such as a data bus port. The output, or match, signal SRSJN is transmitted to connected circuitry for controlling a second access port of the memory, such as a serial bus port. The connected circuitry at each port includes, but is not limited to, input/output circuitry, decoding circuitry, sensing circuitry, timing circuitry, driving circuitry and redundancy circuitry. The connected circuitry, for example, controls transmission of data between the ports and either standard columns of cells or redundant columns of cells, depending on instructions from the match signals.

This invention is not limited to laser fuses. For example, EPROM cells or current-blown fuses may be used.

In summary, the circuit of this invention is used to program both the serial redundancy and column redundancy on a VRAM. It is applicable to any dual or multi-ported device in which a programmable circuit is used to program redundancy of more than one port.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

I claim:

1. A circuit for shared redundancy programming of a memory with at least first and second access ports, each said port having connected circuitry for controlling said port, said memory including cells arranged in columns for storing data, said circuit comprising:

a programmable circuit for storing an internal address;

a first comparison circuit responsive to said internal address and to a first address signal, said first comparison circuit generating a first match signal determined by the matching of said internal address and said first address signal, said first match signal communicated to said connected circuitry of said first access port; and a second comparison circuit responsive to said internal address and to a second address signal, said second comparison circuit generating a second match signal determined by the matching of said internal address and said second address signal, said second match signal communicated to said connected circuitry of said second access port.

2. The circuit of claim 1, wherein said first access port is connected to a data bus.

3. The circuit of claim 1, wherein said second port is connected to a serial bus.

4. The circuit of claim 1, wherein said second address signal is a serial factor input.

5. The circuit of claim 1, wherein said first match signal causes data transmission between a redundant column of said memory and said first port.

6. The circuit of claim 1, wherein said second match signal causes data transmission between a redundant column of said memory and said second port.

7. The circuit of claim 1, wherein said connected circuitry for controlling said port includes redundancy and timing circuitry.

8. A method for programming both serial and column redundancy of a memory having at least first and second access ports, each said port having connected circuitry for controlling said port, said method comprising:

producing and storing an internal address;

comparing said internal address to a first address signal;

generating a first match signal determined by the matching of said internal address and said first address signal and communicating said first match signal to said connected circuitry of said first access port;

comparing said internal address to a second address signal; and generating a second match signal determined by matching said internal address and said second address signal and communicating said second match signal to said connected circuitry of said second access port.

9. The circuit of claim 8, wherein said first access port is connected to a data bus.

10. The circuit of claim 8, wherein said second port is connected to a serial bus.

11. The circuit of claim 8, wherein said second address signal is a serial factor input.

12. The circuit of claim 8, wherein said first match signal causes data transmission between a redundant column of said memory and said first port.

13. The circuit of claim 8, wherein said second match signal causes data transmission between a redundant column of said memory and said second port.

14. The circuit of claim 8, wherein said connected circuitry for controlling said port includes redundancy and timing circuitry.

15. A circuit for shared redundancy programming of a memory with at least first and second access ports, each said port having connecting means for controlling said port, said circuit comprising:

programmable means for producing and storing an internal address;

first comparison means responsive to said internal address and to a first address signal, said first comparison means generating a first match signal determined by the matching of said internal address and said first address signal, said first match signal communicated to said connecting means of said first access port; and a second comparison means responsive to said internal address and to a second address signal, said second comparison means generating a second match signal determined by the matching of said internal address and said second address signal, said second match signal communicated to said connecting means of said second access port.

16. The circuit of claim 15, wherein said first access port is connected to a data bus.

17. The circuit of claim 15, wherein said second port is connected to a serial bus.

18. The circuit of claim 15, wherein said second address signal is a serial factor input.

19. The circuit of claim 15, wherein said first match signal causes data transmission between a redundant column of said memory and said first port.

20. The circuit of claim 15, wherein said second match signal causes data transmission between a redundant column of said memory and said second port.

21. The circuit of claim 15, wherein said connecting means for controlling said port includes redundancy and timing circuitry.

* * * * *